United States Patent [19]
Shoda et al.

[11] Patent Number: 5,177,801
[45] Date of Patent: Jan. 5, 1993

[54] CROSS FADER FOR EDITING AUDIO SIGNALS

[75] Inventors: Akihiko Shoda, Tokyo; Yoshihiro Murakami, Kanagawa, both of Japan

[73] Assignee: Sony Corporation, Tokyo, Japan

[21] Appl. No.: 672,659

[22] Filed: Mar. 22, 1991

[30] Foreign Application Priority Data

Mar. 28, 1990 [JP] Japan .................................. 2-80303

[51] Int. Cl.⁵ .......................... H04B 1/00; H03G 3/00
[52] U.S. Cl. .................................... 381/119; 381/104; 381/109
[58] Field of Search ................ 381/104, 109, 119; 84/625, 660, 464 R, 464 A

[56] References Cited

U.S. PATENT DOCUMENTS

| | | | |
|---|---|---|---|
| 4,631,525 | 12/1986 | Serravalle, Jr. .................... | 381/109 |
| 4,635,288 | 1/1987 | Stadius ............................... | 381/119 |
| 4,879,751 | 11/1989 | Franks et al. ...................... | 381/109 |
| 4,885,792 | 12/1989 | Christensen et al. ............... | 381/119 |

Primary Examiner—James L. Dwyer
Assistant Examiner—Jack Chiang
Attorney, Agent, or Firm—Ronald P. Kananen

[57] ABSTRACT

A cross fader for editing audio signals has first and second bus lines, each including a plurality of channel signal lines and first and second plural selecting and indicating switches, each corresponding to the signal line of the first and second bus lines, for selecting the corresponding signal line responsive to the switching operation and for visually indicating the selected modes of the signal line. A fader mixes signals from the first and second selecting and indicating switches for outputting a mixed signal and for variably controlling the mixing ratio of the signals according to the movement of an operation knob. The first and second selecting and indicating switches are arranged so that said first and second switches are related with one end and the other end of the movement of the operation knob, respectively.

18 Claims, 3 Drawing Sheets

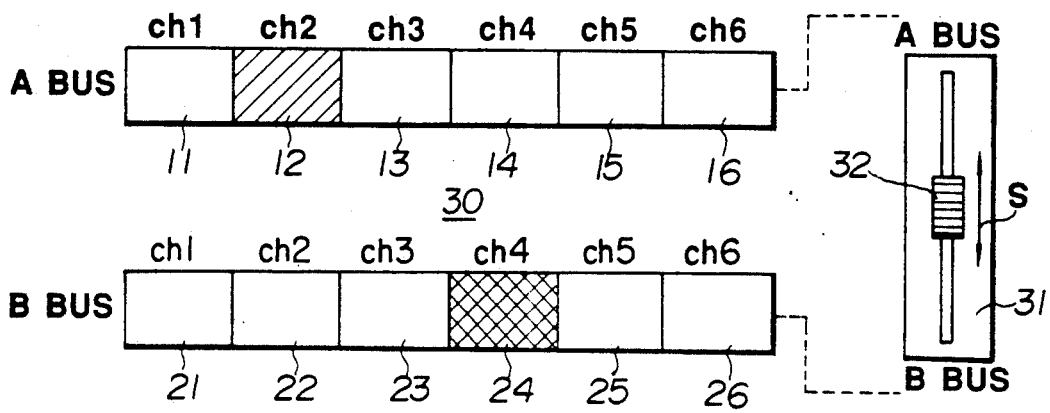
FIG. 1
FIG. 1A
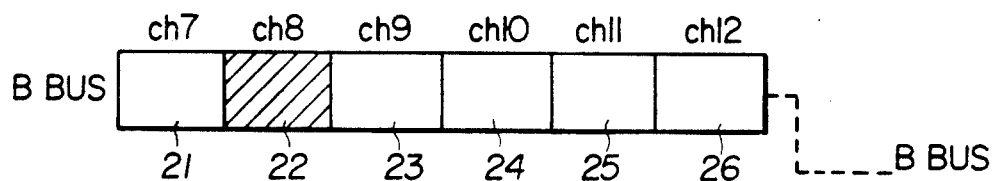
FIG. 1B
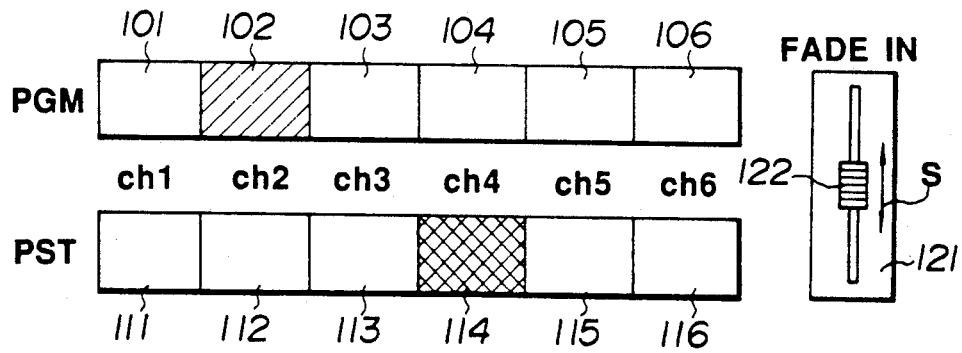
FIG. 3
PRIOR ART

CROSS FADER FOR EDITING AUDIO SIGNALS

BACKGROUND OF THE INVENTION

The present invention relates to an audio signal editing cross fader used for editing audio signals and the like.

There have been conventional cross faders used in a mixer for editing audio signals comprising a program (PGM) bus including signal lines of the audio signals of a plurality of channels and a preset (PST) bus including signal lines of the audio signals of a plurality of channels. A term "cross fader" used herein means an apparatus for adjusting (fading in and out the levels of signals so that, previous sound is superposed on and gradually changed to, subsequent sound before and after an editing point when the audio sounds and the like are edited. An audio signal before the editing point is a signal on the program (PGM) bus. An audio signal after the editing point is the signal on the preset (PST) bus.

For example, as shown in FIG. 3, selecting and indicating switches 101 through 106, 111 through 116 which are connected to signal lines of a plurality of channels (for example, 6 channels ch1 through ch6) and a fader 121 which achieves, fade-in or fade-out, of audio signals by moving an operation knob 122 is a direction of an arrow S (i.e., a vertical direction) are disposed on a control panel of the conventional cross fader 120.

That is, the selecting and indicating switches 101 through 106 are adapted to select a channel to be programmed by turning on, that is, a channel to be faded out before an editing point. The selecting and indicating switches 111 through 116 are adapted to select a channel to be preset by turning on, that is, a channel to be faded in after the editing point. Each of selecting and indicating switches 101 through 106, 111 through 116 glows to indicate which channel is selected when it is turned on. As shown in FIG. 4, the fader 121 fades out the audio signal of a program (PGM) channel according to a curve $F_{OUT}$ in FIG. 4 when the operation knob 122 is moved, for example, from the upper end to the lower end and fades in the audio signal of a preset channel according to a curve $F_{IN}$ in FIG. 4 when the knob 122 is moved, for example, from the lower end to the upper end.

Referring now to FIG. 5, there is shown the schematic structure of a mixer using a usual master fader which performs no cross fading. In FIG. 5, audio signals of channels ch1 through ch6 are supplied to input terminals 131 through 136, respectively. The signals are fed to selecting and indicating switches 151 through 156 via buffer amplifiers 141 through 146, respectively. The switches 151 through 156 are connected with a program bus PB, which is in turn connected with a master fader 160. Accordingly, when any one (or more) of the selecting and indicating switches 151 through 156 is turned on, the signal of the channel selected by turning on is fed to the master fader 160, at which the level of the signal is adjusted and the level adjusted signal is outputted from an output terminal 170.

In the above mentioned conventional cross fader 120, positions of a program bus and a preset bus which are turned on are changed by the vertical movement of the operation knob 122. This is, the indications of the selecting and indicating switches indicating which of the channels which are programmed and preset are changed depending upon the vertical movement of the operation knob 122.

For example, when the channels ch2 and ch4 are in program and preset modes, respectively, both the selecting and indicating switch 102 corresponding to the programmed channel ch2 and the selecting and indicating switch 114 corresponding to the preset channel ch4 light. Movement of the knob 122 to the upper end causes the audio signals of the channels ch2 and ch4 to be faded out and in, respectively. At this time, since the signal of the channel ch2 which has been programmed is faded out, the channel ch2 is brought into a preset mode. Since the signal of the channel ch4 which has been preset is faded in, the channel ch4 is brought into a program mode (refer to FIG. 4). Accordingly, the selecting and indicating switch 102 which indicates a program mode of the channel ch2 fails to light while the selecting and indicating switch 112 which indicates a present mode of the channel ch2 lights. Simultaneously, the selecting and indicating switch which indicates a preset mode of the channel ch4 fails to light while the selecting and indicating switch 104 which indicates a program mode of the channel ch4 lights.

Such changes in program and preset modes are not so troublesome when, for example, video switcher is used since only one source is selected. However, channels to be switched are plural in a switcher which selects (mixes) a plurality of source (audio signals) like a mixer which processes audio signals. Accordingly, change in positions of lighting plural switches due to the above mentioned cross fading operation is very troublesome for an operator of the mixer. That is, since the program and preset buses are relevant to so-called assignment switches in an usual mixer and turning on (lighting) of the assignment switches change by the cross fader, the change in positions of lighting switches are troublesome. Movement of the operation knob of the cross fader in either direction causes a resultant signal to become a faded-in programmed signal. Therefore, the conventional cross fader is very troublesome for users which use a mixer including an usual master fader. The users who are inexperienced in operating such a cross fader may mistake channels which are in program or preset modes, resulting in errors of operation.

Therefore, the present invention was proposed under the above mentioned circumstances.

It is an object to provide a cross fader for editing audio signals which gives, good feeling of use and may reduce errors of operation.

SUMMARY OF THE INVENTION

In order to accomplish the above mentioned object, the present invention provides a cross fader for editing audio signals, comprising: first and second bus lines, each including a plurality of channel signal lines; first and second plural selecting and indicating switches, each corresponding to a signal line of the first and second bus lines, for selecting the corresponding signal line responsive to the switching operation and for visually indicating the selected modes of the signal line; and fader means which mixes signals from the first and second selecting and indicating switches for outputting a mixed signal and for variably controlling the mixing ratio of the signals according to the movement of an operation knob, said first and second selecting and indicating switches being arranged so that said first and second switches are related with one end and the other end of the movement of the operation knob, respectively.

Visual indication of selected modes of the first and second selecting and indicating switches can be realized by using dual color glowing switches and the like which enable users to recognize the difference in selected modes by changing the glowing colors such as red and yellow.

In accordance with the present invention, program and preset modes of the selected channels can be easily recognized since the selected modes of bus lines are visually indicated and the direction of movement of an operation knob of the cross fader is related with the position of the arrangement of the first and second selecting and indicating switches.

BRIEF DESCRIPTION OF THE DRAWINGS

FIGS. 1-1B is a schematic diagram showing the arrangement of alternate embodiments as shown respectively in FIGS. 1A and 1B of an audio signal editing cross fader of the present invention;

FIG. 3 is a schematic diagram showing the arrangement of main parts of a conventional cross fader;

DESCRIPTION OF THE PREFERRED EXBODIMENTS

Figure 2:
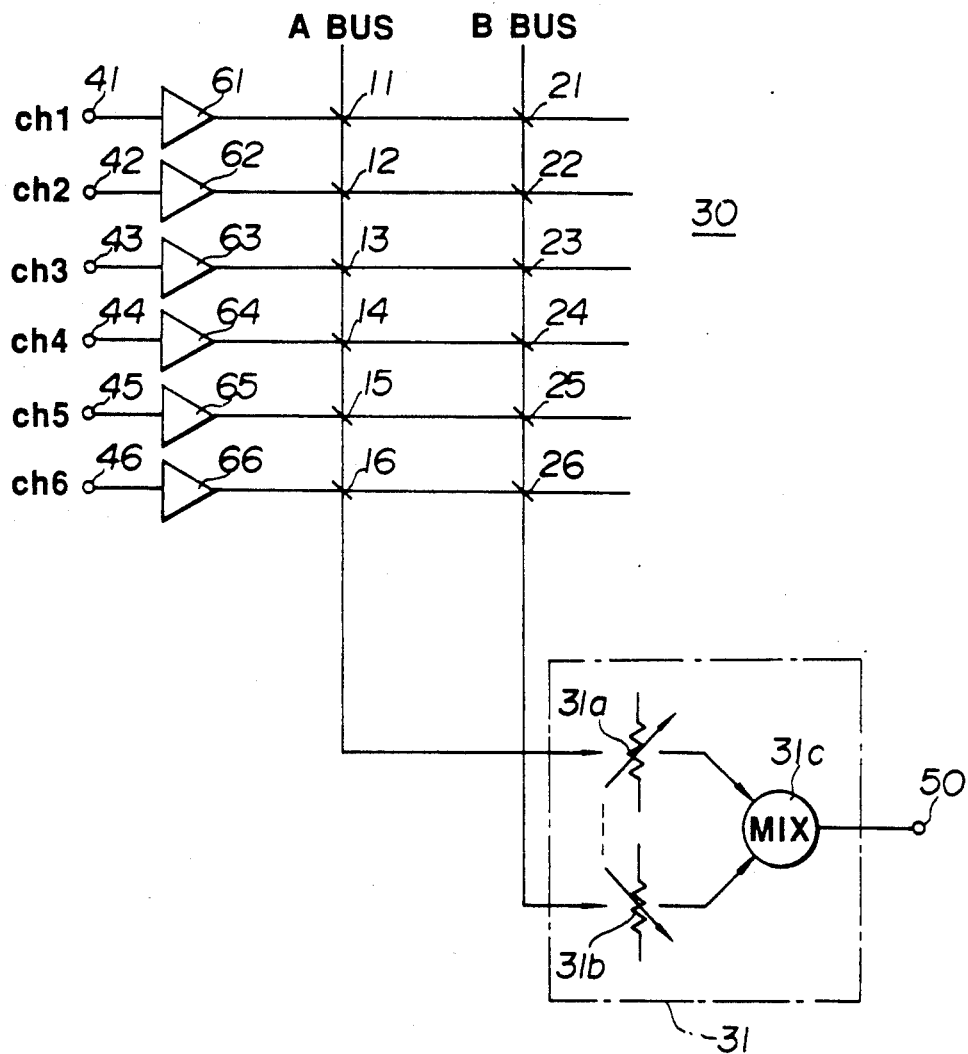
FIG. 2 is a circuit diagram showing the schematic structure of a circuit of the cross fader of the present embodiment.
Figure 4:
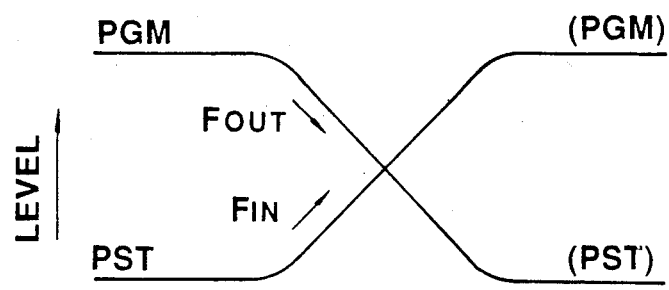
FIG. 4 is a graph for illustrating fade-in and fade-out operation performed by the cross fader.
Figure 5:
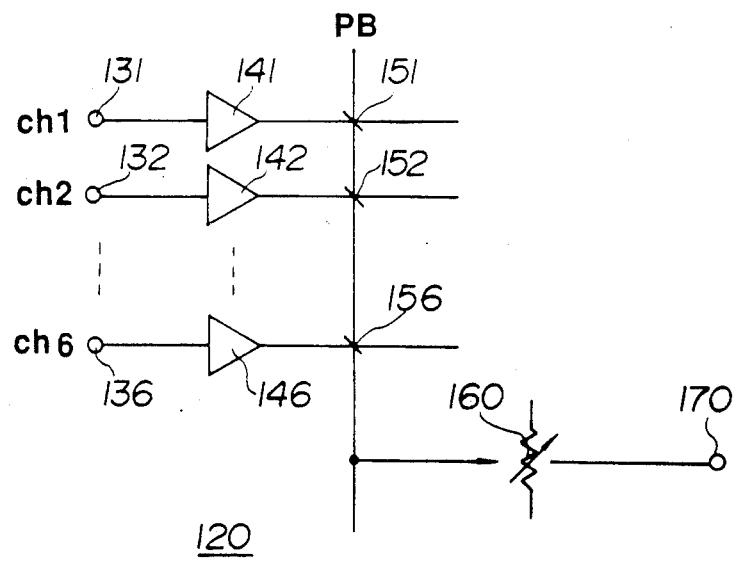
FIG. 5 is a schematic circuit diagram showing the structure of a mixer using a conventional master fader.

Embodiments of the present invention will now be described with reference to the drawings.

Referring now to FIG. 1A, there is shown the arrangement of main components on a control panel of an embodiment of a cross fader 30 for editing audio signals of the present invention.

The cross-fader 30 of the present embodiment shown in FIG. 1A comprises an A bus which is a first bus line and a B bus which is a second bus line, each bus including a plurality of (for example, 6) channel signal lines to which audio signals ar supplied; a plurality of A bus selecting and lighting switches 11 through 16 which are first selecting and indicating switches and a plurality of B bus selecting and lighting switches 21 through 26 which are second selecting and indicating switches, one provided for each signal line of the bus lines of the A and B buses, for selecting one of the signal lines responsive to the switching operation and for visually indicating the selected mode (for example, indicating one of different glowing colors such as red and yellow); and a fader 31 for mixing the signals from the A and B bus selecting and glowing switches 11 through 16, 21 through 26 to output the mixed signals and for variably controlling the mixing ratio of the signals responsive to the movement of a knob 32, for example in a direction of an arrow S. The A bus selecting and glowing switches 11 through 16 are disposed so that they are related with one end to which the knob 32 of the fader 31 is moved and the B bus selecting and lighting switches 21 through 26 are disposed so that they are related with the other end to which the knob 32 is moved.

That is, the audio signals are on channels ch1 through ch6 of each of A and B buses in FIG. 1A. For example, the audio signal of the channel ch1 is supplied to the A and B bus selecting and lighting switches 11 and 21. The signal of the channel ch2 is supplied to the A and B bus selecting and glowing switches 12 and 22. The signal of the channel ch6 is supplied to the A and B bus selecting and glowing switches 16 and 26 similarly to the foregoing. The channels of the A bus may be different from those of the B bus. For example, the channels of the A bus may be channels ch1 through ch6 whereas the channels of the B bus may be channels ch7 through ch12. Each of A and B bus selecting and glowing switches comprises a dual color glowing switch which is capable of changing the glowing colors, for example, red and yellow. When it glows red, it indicates a program bus (that the channel is in a program mode). When it glows yellow, it indicates a preset bus (that the channel is in a preset mode). Accordingly, use of each A and B selecting and glowing switch in which a change in glowing colors makes it easy to recognize the difference in selection modes of program and present. It is, of course, that the glowing colors of the dual color glowing switch are not limited to only red and yellow and may be the other colors if the difference therebetween may be clearly recognized. However, the glowing colors of the switches should be unified corresponding to the selected mode, program or preset mode. The selecting and glowing switch may not be a dual color glowing switch, but a mono color glowing switch.

The A and B bus selecting and glowing switches 11 through 16, 21 through 26 are arranged so that both switches have a physically positional relation as shown by a dotted line in FIG. 1A. For example, as is exemplarily shown in FIG. 1A, if the fader 31 is disposed so that the operation knob 32 is vertically movable on the control panel of the cross-fader, the A bus selecting and glowing switches 11 through 16 are disposed in the upper side of the control panel so that they correspond to the upper end of the fader 31 while the B bus selecting and glowing switches 21 through 26 are disposed in the lower side of the control panel so that they correspond to the lower end of the fader 31. In this fader 31, the audio signal of the channel in which the preset mode is selected by any one of the A bus selecting and glowing switches 11 through 16 is faded in and the channel is brought into a program mode when the operation knob 32 is moved to the upper end and the audio signal of the channel in which a preset mode is selected by any one of the B bus selecting and glowing switches 21 through 26 is faded in and the channel is brought into a program mode when the operation knob 32 is moved to the lower end.

The fader is adapted to mix the signals, each from the A and B bus selecting and glowing switches and to output the mixed signal as described above. For example, in the case that the channel ch2 is selected by turning on the A bus selecting and glowing switch 12 and the channel ch4 is selected by turning on the B bus selecting and glowing switch 24, the channel ch2 is in a program mode and the switch 12 glows in red and the channel ch4 is in a preset mode and the switch 24 glows in yellow when the operation knob 32 of the fader 31 is positioned at the upper end thereof. Accordingly, when the operation knob 32 is moved from the upper end to the lower end, the signal of the channel 4 is faded in and the signal of the channel 2 is faded out. In association with this, the A bus selecting and glowing switch 12 changes to glow yellow indicative of a preset mode and the B bus selecting and glowing switch 24 changes to glow red indicative of a program mode.

The cross fader of the present embodiment comprises A and B bus selecting and glowing switches 11 through 16, 21 through 26 which visually indicate the selected modes in, for example, red and yellow and a fader 31 which mixes the signals from the A and B bus selecting and glowing switches and variably controls the mixing ratio responsive of the movement of the operation knob 32. The A and B bus selecting and glowing switches and the direction of the movement of the operation knob 32 of the fader 31 have a physically positional relation as described above. Accordingly, it can be easily recognized which mode the channels selected by the A and B bus selecting and glowing switches are in. Since the selected modes can be easily recognized in such a manner, the feeling of use is so excellent that even an inexperienced operator can reduce errors in operation.

Referring now to FIG. 2, there is shown a schematic circuit structure of the cross fader 30 of the present embodiment. In FIG. 2, the audio signals of the channels ch1 through ch6 are supplied to input terminals 41 through 46, respectively. These signals are fed to the A and B bus selecting and glowing switches 11 through 16, 21 through 26 via buffer amplifiers 61 through 66. The A bus selecting and glowing switches 11 through 16 are connected with an A bus. The B bus selecting and glowing switches 21 through 26 are connected with a B bus. The A and B buses are connected with the fader 31. The fader 31 comprises level adjusters 31a and 31b which are inversely interlocked with each other and are connected with the A and B buses, respectively and a mixer 31c for mixing the A bus signal with the B bus signal. Since the level adjuster 31a is inversely interlocked with the level adjuster 31b, the level adjuster 31b raises the level of the signal when the level adjuster 31a lowers the level of the signal. Accordingly, when any one (or more) of the each of selecting and glowing switches are turned on, the audio signals of the channels selected by the turning on are fed to the fader 31 and the levels of the signals are adjusted and the signals are mixed with each other and the mixed signal is outputted from an output terminal 50. This makes it possible to use the A and B bus as a program bus of a mixer using a usual master fader. Accordingly, the cross fader of the present embodiment may be used as a master fader.

Another embodiment of the present invention in which the audio signals of the channels of the A bus are different from those of channels of the B bus is possible, as shown in FIG. 1B. In this case, the channels ch1 through ch6 may be connected with the A bus whereas the channels ch7 through ch12 may be connected with the B bus. For example, the signals of the channels ch1 through ch6 are supplied to the A bus selecting and glowing switches 11 through 16 whereas the signals of the channels ch7 through ch12 are supplied to the B bus selecting and glowing switches 21 through 26. In this embodiment of FIG. 1B, each of the A and B bus selecting and glowing switches also comprises a dual color glowing switch as is similar to the former embodiment of FIG. 1A and is adapted to glow red and yellow indicative of program and present modes, respectively. Accordingly, use of the A and B bus selecting and glowing switches which change the glowing colors makes it possible for operation to easily recognize the difference in selected modes, program or preset modes.

Also in the present FIG. 1B embodiment, the A and B bus selecting and glowing switches 11 through 16, 21 through 26 and the fader 31 are disposed so that they have a physically positional relation with each other as is similar to the foregoing. For example, the A bus selecting and glowing switches are disposed on the upper side so that they correspond to the upper end of the fader 31. The B selecting and glowing switches are disposed on the lower side so that they correspond to the lower end of the fader 31.

Also in the fader of the present embodiment, when the operation knob 32 is moved to the upper end, the signal of the channel selected by one of the A bus selecting and glowing switches 11 through 16 is faded in. When the operation knob is moved to the lower end, the signal of the channel selected by one of the B bus selecting and glowing switches 21 through 26 is faded in. Accordingly, for example, in the case that the channel ch2 is selected by turning on the A bus selecting and glowing switch 12 and the channel ch10 is selected by turning on the B bus selecting and glowing switch 24, when the operation knob 32 is positioned at the upper end, the A bus selecting and glowing switch 12 glows red and the channel ch2 is brought into a program mode, and the B bus selecting and glowing switch 24 glows yellow and the channel ch10 is brought into a present mode. When the operation knob 32 is moved to the lower end at this time, the signal of the channel ch10 is faded in and the A bus selecting and glowing switch 12 changes to glow yellow indicative of a preset mode and the signal of the channel ch2 is faded out and the B bus selecting and glowing switch 24 changes to glow red indicative of a program mode.

As is apparent from the foregoing, it is appreciated that which mode, program or preset mode the channel selected by the A or B bus selecting and glowing switch is in is easily recognized also in the cross fader of the present embodiment as mentioned above. Since the selected mode is easily recognized, the feeling of use is excellent and even in experienced operator can reduce errors in operation.

While preferred embodiments has been described, it is to be understood that changes and variations may be made without departing from the spirit or scope of the following claims.

We claim:

1. A cross fader for editing audio signals, comprising:
   first and second bus lines, each including a plurality of channel signal lines;
   first and second plural selecting and indicating switches, each respectively corresponding to a respective signal line of the first and second bus lines, for selecting the corresponding signal line responsive to a switching operation and for visually indicating at a surface of a control console a selected mode of the signal lines; and
   fader means for mixing signals from selected first and second selecting and indicating switches, when switched, for outputting a mixed signal and for variably controlling the mixing ratio of the respective selected signals according to the movement of an operation knob operable from a surface of said console, wherein said first and second selecting and indicating switches are arranged so that said first and second switches are respectively physically related on a surface of the console to one end and to the other end of the movement of the operation knob of said fader means, respectively;
   wherein said first and second selecting and indicating switches comprise dual color glowing switches which change the glowing colors depending upon a selected mode thereof.

2. A cross fader for editing audio signals as defined in claim 1 in which the glowing colors are red and yellow.

3. A cross fader for editing audio as defined in claim 1 in which the selected mode includes a program mode in which the signal is to be faded out and a preset mode in which the signal is to be faded in.

4. A cross fader for editing audio signals as defined in claim 1 in which the channels of the first bus are different from the channels of the second bus.

5. A cross fader for editing audio signals, comprising:
first and second bus lines, each including a plurality of channel signal lines;
first and second plural selecting and indicating switches, each respectively corresponding to a respective signal line of the first and second bus lines, for selecting the corresponding signal line responsive to a switching operation and for visually indicating at a surface of a control console a selected mode of the signal lines; and
fader means for mixing signals from selected first and second selecting and indicating switches, when switched, for outputting a mixed signal and for variably controlling the mixing ratio of the respective selected signals according to the movement of an operation knob operable from a surface of said console, wherein said first and second selecting and indicating switches are arranged so that said first and second switches are respectively physically related on a surface of the console to one end and to the other end of the movement of the operation knob of said fader means, respectively;
wherein said first and second selecting and indicating switches are arranged in at least two lines in a parallel relationship with each other and said fader knob travels adjacent and transverse to said parallel lines.

6. A cross fader for editing audio signals, comprising:
a first bus line which includes a first plurality of channel signal lines;
a second bus line which includes a second plurality of channel signal lines;
first switch means, including a first plurality of selecting and indicating switches respectively connected to said first bus line, each of said first plurality of switches corresponding to a selected one of said first plurality of channel signal lines, for selecting a corresponding signal line from said first plurality of channel signal lines responsive to a switching operation and for visually indicating at a surface of a control console a selected mode of the selected one of the first plurality of signal lines;
second switch means, including a second plurality of selecting and indicating switches respectively connected to said second bus line, each of said second plurality of switches corresponding to a selected one of said second plurality of channel signal lines, for selecting a corresponding signal line from said second plurality of channel signal lines responsive to a switching operation and for visually indicating at said surface of said control console a selected mode of the selected one of the second plurality of signal lines;
fader means for mixing signal from the selected first and second channel signal lines via said first and second plurality of selecting and indicating switches for outputting a mixed signal representative thereof and for variably controlling the mixing ratio of the signals from the selected first and second channels, said fader means including an operation knob movable between a first position and a second position at said surface of said console;
said first and second selecting and indicating switches being physically arranged so that said first plurality of switches is physically positionally related to said first position and said second plurality of switches is physically positionally related to said second position of said operation knob;
wherein said first and second selecting and indicating switches comprise dual color glowing switches which change their glowing colors depending upon a selected mode thereof.

7. The cross fader as set forth in claim 6 wherein said first position of said operation knob indicates a first mode for a selected signal from said first plurality of channel signal lines and a second mode for a selected signal from said second plurality of channel signal lines, and said second position of said operation knob indicates a second mode for said selected signal from said first plurality of channel signal lines and a first mode for a selected signal from said second plurality of channel signal lines.

8. The cross fader as set forth in claim 6 wherein a selected mode includes a program mode in which the selected signal is to be faced in and a present mode in which the signal is to be faded out.

9. The cross fader as set forth in claim 7 where said first mode is a program mode and said second mode is a preset mode.

10. The cross fader as set forth in claim 7 wherein said first and said second selecting and indicating switches comprise dual color glowing switches which change their glowing colors depending upon whether a first or a second mode is selected.

11. The cross fader as set forth in claim 6 wherein the signals on said first plurality of channel signal lines are the same as the signals on said second plurality of channel signal lines.

12. The cross fader as set forth in claim 6 wherein the signals on said first plurality of channel signal lines are different from the signals on said second plurality of channel signal lines.

13. The cross fader as set forth in claim 6 wherein the first mode is a faded-in mode and said second mode is a faded-out mode.

14. A cross fader for editing audio signals, comprising:
a first bus line which includes a first plurality of channel signal lines;
a second bus line which includes a second plurality of channel signal lines;
first switch means, including a first plurality of selecting and indicating switches respectively connected to said first bus line, each of said first plurality of switches corresponding to a selected one of said first plurality of channel signal lines, for selecting a corresponding signal line from said first plurality of channel signal lines responsive to a switching operation and for visually indicating at a surface of a control console a selected mode of the selected one of the first plurality of signal lines;
second switch means, including a second plurality of selecting and indicating switches respectively connected to said second bus line, each of said second plurality of switches corresponding to a selected one of said second plurality of channel signal lines, for selecting a corresponding signal line from said second plurality of channel signal lines responsive to a switching operation and for visually indicating at said surface of said control console a selected mode of the selected one of the second plurality of signal lines;

fader means for mixing signal from the selected first and second channel signal lines via said first and second plurality of selecting and indicating switches for outputting a mixed signal representative thereof and for variably controlling the mixing ratio of the signals from the selected first and second channels, said fader means including an operation knob movable between a first position and a second position at said surface of said console;

said first and second selecting and indicating switches being physically arranged so that said first plurality of switches is physically positionally related to said first position and said second plurality of switches is physically positionally related to said second position of said operation knob; and further including a control panel, wherein said first plurality and said second plurality of said selecting and indicating switches are respectively arrayed on said control panel in first and second generally parallel lines and said operation knob travels adjacent and transverse to said parallel lines.

15. The cross fader as set forth in claim 14 wherein said first and said second positions for said operation knob are arrayed on said control panel at respective ends of said first and said second lines, so that said operation knob also physically indicates the selected mode for each line and approximately the mixing ratio of said signals.

16. The cross fader as set forth in claim 15 wherein said first and said second parallel lines of said switches are about horizontal while a path for movement of said operation knob between said first and said second positions is approximately vertical.

17. The cross fader as set forth in claim 6 wherein said fader includes a first level adjuster connected to receive selected signals from said first plurality of channel signal lines and a second level adjuster connected to receive selected signals from said second plurality of channel signal lines, said first and said second level adjusters being inversely interlocked with said operation knob so that when said first level adjuster raises the level of the selected signal from the first plurality of channel signal lines, the second level adjuster lowers the level of the selected signal from the second plurality of channel signal lines.

18. A cross fader for editing audio signals, comprising:

a control panel;

a first plurality of selecting and indicating switches arrayed in a first row on said control panel for selecting a corresponding signal line of a first plurality of signal lines on a first bus line and visually indicating the selected mode of the selected first signal line;

a second plurality of selecting and indicating switches arrayed in a second row on said control panel for selecting a corresponding signal line of a second plurality of signal lines on a second bus line and visually indicating the selected mode of the selected second signal line, said first and second rows being located about parallel and about horizontal on said control panel; and a fader having an operation knob movable between a first position at about the end of the first row and a second position at about the end of the second row for mixing signals from selected first and second selecting and indicating switches, said first position indicating a first selected mode and said second position indicating a second selected mode wherein said first and second selecting and indicating switches comprise dual color growing switches which change the glowing colors depending upon a selecting mode thereof.

* * * * *